United States Patent [19]

Grant

[11] 4,413,229
[45] Nov. 1, 1983

[54] METHOD AND APPARATUS FOR REMOTE INDICATION OF FAULTS IN COAXIAL CABLE R-F TRANSMISSION SYSTEMS

[76] Inventor: William O. Grant, 9667 Lindenbrook St., Fairfax, Va. 22031

[21] Appl. No.: 269,624

[22] Filed: Jun. 2, 1981

[51] Int. Cl.³ .............................................. G01R 31/08
[52] U.S. Cl. .................................. 324/52; 179/175.3 F
[58] Field of Search ................... 324/52; 179/175.3 F, 179/175.31 R

[56] References Cited

U.S. PATENT DOCUMENTS

| | | |
|---|---|---|
| 2,291,533 | 7/1942 | Cummings . |
| 3,083,270 | 3/1963 | Mayo ........................ 179/175.31 R |
| 3,312,791 | 4/1967 | Markl et al. ................. 179/175.3 F |
| 3,345,560 | 10/1967 | Perkins . |
| 3,551,804 | 12/1970 | Weddle . |
| 3,771,049 | 11/1973 | Piccione . |
| 4,104,582 | 8/1978 | Lambertsen . |
| 4,110,683 | 8/1978 | Cason et al. |
| 4,209,666 | 6/1980 | Lawton . |

Primary Examiner—Stanley T. Krawczewicz
Attorney, Agent, or Firm—Ronald R. Snider

[57] ABSTRACT

A method for locating faults or failures in R-F coaxial cable TV transmission facilities is shown and described. A fault locator signal frequency is inserted into a cable system, and low magnitude signals are emitted by means of a band pass filter and radiating element. The radiated R-F is detected to determine coaxial cable system operation. Band pass filters and radiating elements are located at each point to be tested.

An apparatus for emitting a controlled narrow band of R-F energy which utilizes a band pass filter and a radiating element is also shown and described.

This is the disclosure of intentional, controlled, discriminate R-F radiation used for fault detection and a coupler-band pass filter to accomplish it.

17 Claims, 8 Drawing Figures

METHOD AND APPARATUS FOR REMOTE INDICATION OF FAULTS IN COAXIAL CABLE R-F TRANSMISSION SYSTEMS

BACKGROUND OF THE INVENTION

1. Field of the Invention

In the operation and maintenance of coaxial cable R-F transmission systems of the type that are used for cable television (CATV), it is necessary to quickly locate and correct equipment malfunctions or faults. Such systems may have many amplifiers, connector devices, passive couplers, and passive taps, any one of which may become defective during use. An R-F transmission coaxial cable system is therefore inherently prone to service interruptions due to the multiplicity of devices required.

Direct physical inspection of the devices in an R-F transmission system may be very time-consuming, and even somewhat hazardous when equipment is located on poles. Direct inspection requires the physical opening of the system, and the mere act of inspection may cause further interruption of service to customers still unaffected. Still further, if the equipment is not properly reassembled, inspection itself may induce R-F leakage or faults.

It is therefore desirable to have a method and apparatus which will permit the detection of equipment faults or service outage points without direct physical inspection and without climbing poles to inspect each location.

2. Description of the Prior Art

At present the usual method of fault detection is the physical inspection of various points in the system in order to locate faults. If an inspection reveals no fault, then the process must be repeated in a hit or miss fashion until the fault is found. This can be a time-consuming and expensive process which deprives customers of service time and raises service cost.

Often the best indication of service outages and subsequent fault location is the reports of failure received from users of CATV systems. However, this is at best unreliable, and in rural areas is quite imprecise because of the large distance between users. In urban areas, customer reports are also imprecise because of the complex systems and many users.

Several manufacturers presently offer sophisticated and expensive status monitoring and reporting equipment which can identify a failure in any one of hundreds, or even thousands, of in-service amplifiers. These systems merely locate the fault, and it is still necessary for personnel to travel to the site to correct the problem.

In the past, sometimes faults have been detected by common R-F leak detectors while checking the system for leakage. However, this is very unreliable because if a system is without R-F leakage, a person checking for faluts will observe no R-F and consequently be misled into believing that there is a complete absence of R-F in the system. The absence of a reliable, controlled source of detectable R-F emission from R-F coaxial systems renders this approach to the problem almost useless.

SUMMARY OF THE INVENTION

1. Brief Description

This invention relates to a method and apparatus for testing for faults in R-F cable transmission systems. The invention uses a predetermined fault locator signal frequency which is inserted into the transmission system. The fault locator signal frequency may be modulated to a particular tone or beat which can be audibly detected by a person operating a receiver detector. R-F emitting coupler filters are placed at each test point. The R-F emitting coupler filters are tuned to the same frequency as the fault locator signal frequency, or test carrier frequency. When it is desired to find a transmission fault, each coupler-filter location is checked by the use of a receiver which is also tuned to the fault locator signal frequency. If any location is not emitting the fault locator signal frequency, then the site is investigated for the cause of the transmission failure. The initial observation is made at a distance from the R-F emitting coupler filters, and there is no need to closely physically inspect each location.

The R-F emitting coupler filters are designed to attach to standard amplifier and cable terminals. The R-F coupler filters include a means for picking up the R-F signals from within the system, a filter means tuned to the predetermined fault locator frequency, and a radiating element for transmitting only the fault locator frequency outside of the coaxial system.

2. Objects and Advantages of the Invention

This invention provides an inexpensive method and apparatus by which faults in R-F coaxial transmission systems can be detected.

It is an object of this invention to eliminate the time-consuming and somewhat hazardous physical opening and inspections of transmission system components.

It is an object of this invention to provide a method which is compatible with existing Federal Communications Commission R-F emissions standards.

It is an object of this invention to provide a method of determining if there is R-F energy in a system without requiring any physical contact with the coaxial transmission system.

The primary purpose of this invention is achieved by the simple detection of the presence or absence of R-F energy in an R-F coaxial system.

It is a further object of the invention to provide for a plurality of predetermined discriminate fault locator frequencies and test routines when a plurality of coaxial transmission systems are to be tested and are likely to interfere with each other.

It is a further object of this invention to provide for detection of a fault at a distance away from the coaxial cable equipment.

It is a further object to provide for discriminate emission of R-F energy, or only a narrow band of transmission to the exterior of the coaxial cable system.

It is still a further object of this invention to provide for Remote Indication Fault Locating Equipment for coaxial cable R-F transmission systems. Hereinafter, in describing various applications of this system, the acronym RIFLE is used to describe the method and apparatus of this invention. The fault locator signal frequency is also known as the RIFLE test carrier.

DETAILED DESCRIPTION OF THE PREFERRED EMBODIMENT

Figure 1:
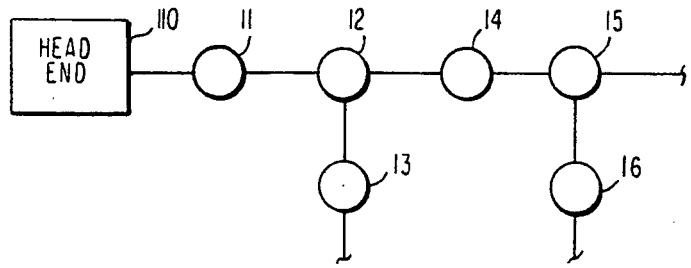
FIG. 1 shows schematically a typical R-F coaxial cable TV transmission system which is unidirectional, which includes a head end insertion point, and which has many amplifiers.

FIG. 1 shows a typical R-F coaxial cable transmission system of the type used in CATV systems. The head end 10 represents the point of insertion of the signal into the line. The system includes amplifiers 11, 12, 13, 14, 15, and 16 which maintain the signal strength at the desired level. There are obviously many more amplifiers and branches in this type of system than the small number shown.

Figure 8:
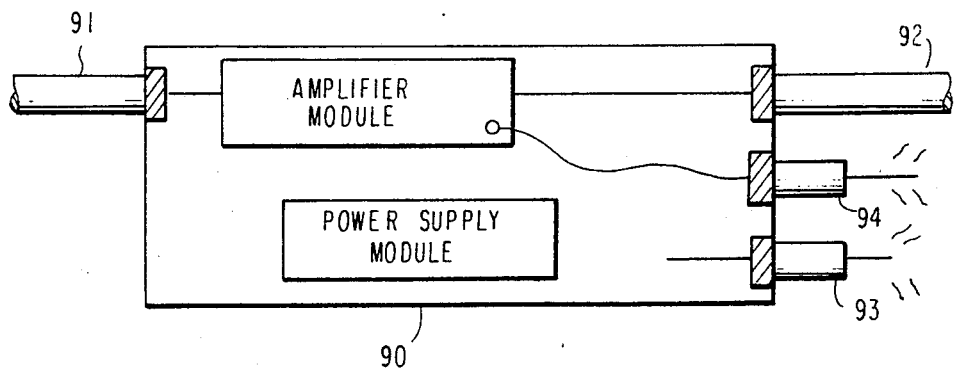
FIG. 8 shows schematically an amplifier unit with both inductive and direct connection R-F emitting couplers attached.

Each amplifier may have one or more R-F emitting coupling filters inserted into cable connections or user tap terminals. These are generally depicted in FIG. 8.

When a fault in one of the amplifiers 11 through 16 is suspected, a predetermined fault locator frequency signal is applied at the head end 10. Each amplifier 11 through 16 is then observed by means of a suitable detector to determine if the predetermined falut locator frequency (RIFLE test carrier) is being emitted from the R-F emitting coupling filter associated with the amplifier. If no RIFLE emission is observed, then the fault is detected.

Observation may be done by any suitable R-F receiving device. In some cases an F.M. radio receiver may suffice. The operator merely listens to the tone on the radio produced by the modulation of the RIFLE test carrier frequency. For more precise measurements and reliability, R-F leakage detectors which are currently used to test CATV systems may be used. These systems already provide an identifiable test carrier and sophisticated detection capability. The R-F leakage detector is tuned to the predetermined fault locator frequency. Leakage detectors such as the ST-1C transmitter and the CR-1 receiver manufactured by Mid-State Communications, Inc., 174 South First Avenue, Beech Grove, Ind., and the ST-200 transmitter and SR-200 receiver manufactured by Comsonics, Inc., P.O. Box 1106, Harrisonburg, Va., are particularly suitable for detecting the predetermined fault locator frequency signal. If it is desired to use a separate frequency for R-F leak detection than the RIFLE test carrier frequency, then existing equipment may have to be modified to provide for the two frequency capability. It is of course to be understood that any R-F receiver tuned to the predetermined frequency can be used in practicing the method of this invention.

Once a fault has been detected and correction procedures have been instituted, this RIFLE procedure may then continue to locate other faults in the system.

Figure 2:
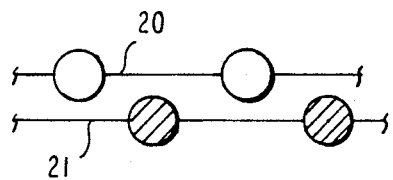
FIG. 2 shows a portion of two R-F coaxial cable TV transmission systems which physically parallel each other.

In FIG. 2 there is shown a pair of R-F coaxial transmission systems which are located together, or in the same general location. In order to detect faults by the RIFLE system, it may be desirable to use a first predetermined fault locator frequency for cable system 20 and a second different predetermined fault locator frequency for cable system 21. In this manner, the different RIFLE R-F emissions prevent confusion between the two systems.

Figure 3:
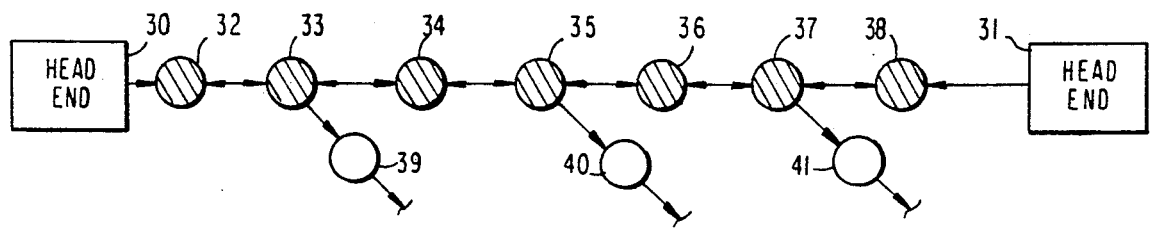
FIG. 3 shows a two-way coaxial system wherein a portion of the system handles transmissions in both directions.
Figure 4:
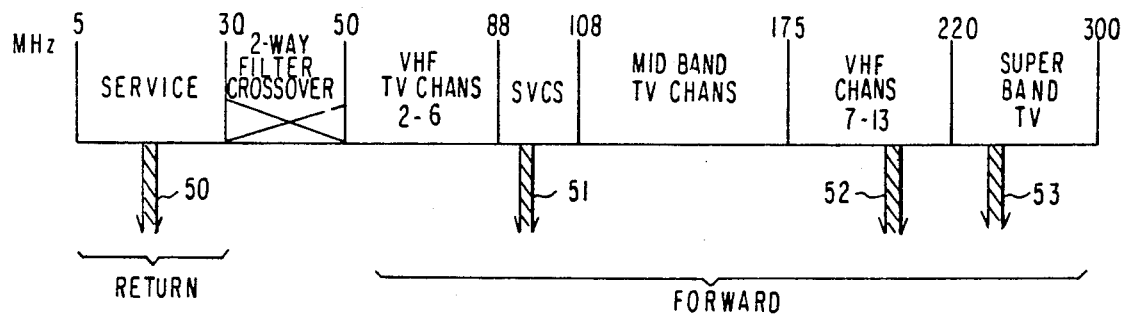
FIG. 4 shows a typical R-F band spectrum with uses assigned to each frequency, and a return band.

In FIG. 3 there is shown a two-way R-F coaxial transmission system. There are two head ends (insertion points) 30 and 31. Amplifiers 32, 33, 34, 35, 36, 37, and 38 are two-way devices which transmit different frequencies in both directions. A typical frequency allocation for forward and return communications is shown in FIG. 4. Amplifiers 39, 40, and 41 are in this application one-way transmission devices and are included to show how such a system may be arranged. In order to find faults in this system it is necessary to employ two sets of R-F emitting coupler filters on each of the two-way amplifiers 32 through 38. A single RIFLE test carrier checks only the forward or return transmissions. Only a single R-F emitting coupler is required on the one-way amplifiers 39 to 41. Separate RIFLE procedures are repeated for the transmissions inserted at head end 30 and for transmissions inserted at head end 31. In this way, the equipment servicing each direction of transmission is fault tested. Obviously since amplifiers 39 to 41 are only single way devices, only one RIFLE test need be conducted.

In FIG. 4, there is shown various uses of the R-F transmission band common to coaxial cable systems. The downward directed segments 50, 51, 52, and 53 represent four possible choices for the predetermined fault locator frequency signals that are inserted into the system. As explained in reference to FIG. 3 above, a first fault locator frequency 50 is required for a return signal, and a second fault locator signal 51, 52, or 53 may be used for the forward transmission.

Selection of the fault locator signal frequency from the broad band R-F transmission spectrum is a matter of pragmatic choice. The selected frequency (1) should not interfere with any TV, FM, or service frequencies used in the coaxial cable R-F system, (2) should not interfere with any local R-F transmissions from either FM or TV stations, (3) should comply with Federal Communications Commission requirements and regulations, and (4) should not be disturbed by insertion of signals into the coaxial system by local R-F transmission equipment. Even with these and other constraints, there is a large number of potential fault locator signal frequencies available. It has been found that the FM band is most suitable for fault locator signal selection.

The RIFLE test is also enhanced by modulating the fault locator signal frequency so that it produces a unique and clearly audible tone.

Figure 5:
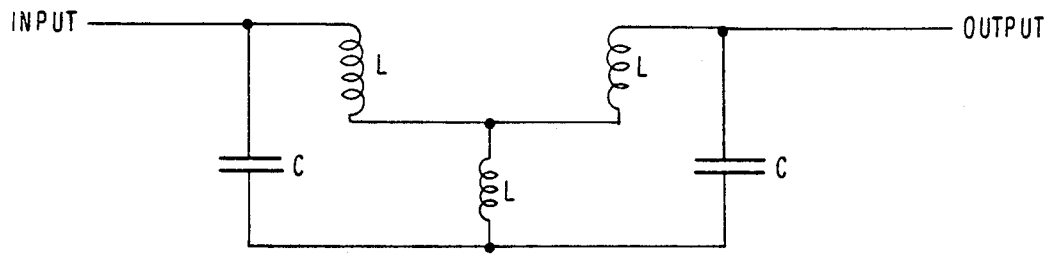
FIG. 5 shows a typical R-F filter which may be used to limit the emission of R-F from the system to a preselected value, or the RIFLE test carrier.

In FIG. 5 there is shown a filter which may be used with each R-F emitting coupler filter used in the RIFLE system. The filter is a narrow band pass filter which allows only the fault locator signal frequency to pass outside of the coaxial system. This filter is essential; otherwise the entire spectrum of transmission will "leak" from the system at each coupler. This would produce R-F interference throughout the area and be out of compliance with Federal Communications Commission requirements for CATV system integrity and would produce expensive power losses.

The design of the filter is of course purely a matter of choice and will vary with the operating frequency and other conditions. The design will suffice as long as it meets the operational requirement of transmitting the fault locator signal frequency (RIFLE test carrier) while blocking other frequencies present.

Figure 6:
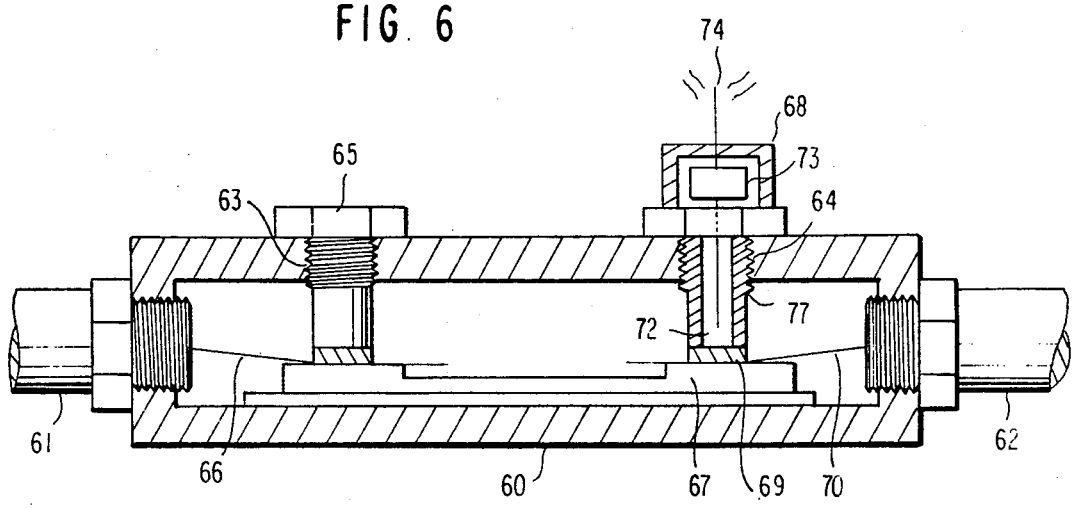
FIG. 6 shows a typical R-F coupling device with an R-F emitting coupler filter which uses inductive coupling inserted into one of the coupling device terminals.

In FIG. 6 there is shown a standard splice connector 60 having coaxial cable input 61 and output 62. The connector is adapted to receive cable connectors at openings 63 and 64. In opening 63 there is shown a dummy plug 65 which depresses the connector tab 66 of cable 61 to make contact with the conductor bar 67.

At opening 64 there is shown an R-F emitting coupler-filter 68 which is used in this invention. The coupler-filter shown here is the inductive pick up type. The coupler-filter end 69 engages the wire 70 from cable 62 and presses it against the conductor bar 67. An inductive pick up 71 is enclosed by a dielectric material 72 within the housing of the coupler-filter. The inductive pick up 71 is connected to a band pass filter 73 which permits only the fault locator signal frequency to pass to the radiating element 74. The radiating element 74 provides for the controlled leakage of the predetermined fault locator signal frequency.

Figure 7:
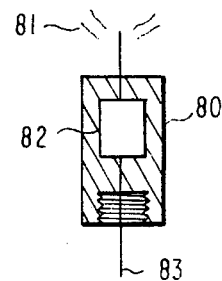
FIG. 7 shows an R-F emitting coupler filter which uses a direct contact to the R-F signal source.

In FIG. 7 there is shown a variation of the R-F emitting coupler-filter 80 which is constructed as a cap rather than a plug. The emitter element 81 is connected to an R-F filter 82. The R-F filter has a direct wire connection 83 which extends to a suitable connection, such as an amplifier or connector element.

It is obvious from the descriptions of the R-F emitting coupler-filters shown in FIGS. 6 and 7 that they may assume any suitable physical configuration. The requirement is that there be a means for picking up the R-F from within the coaxial cable system, a band pass filter, and a radiating element.

In other instances, the R-F emitting coupler-filter may be substituted for the normal terminating resistor on an unused subscriber tap service drop fitting. Some manufacturers provide test point openings in amplifier housings, and these may be used to provide for R-F emitting coupler-filter attachment. New equipment designs may even include the R-F emitting coupler-filters as an integral part of the design.

R-F energy levels within amplifier or connector housings are entirely predictable and limited. The efficiency of the design of the R-F pick up can be controlled, and the filter characteristics and transmission losses can be controlled. For these reasons, the level of radiated energy is controllable and can be maintained below permissable Federal Communications Commission limitations.

In FIG. 8 there is shown an amplifier unit 90 with coaxial cables 91 and 92 connected to it. There are shown two different R-F emitting coupler-filters. Coupler-filter 93 is of the inductive type without a direct connection to the amplifier, and coupler-filter 94 is the direct connection type. The use of two or more coupler-filters is contemplated in applications which may require two or more predetermined frequencies as was discussed in the description of FIG. 3.

In actual use of the RIFLE system described herein, reporting of initial failure problems may be by subscribers or automated reporting equipment. The actual detection or sensing of the RIFLE test carrier can be done from a vehicle traveling along a road adjacent to an R-F coaxial transmission system.

From the above description it can be seen that this method and apparatus provides an efficient and inexpensive way to detect faults in R-F coaxial cable systems.

What is claimed is:
1. A method of remote fault location for a coaxial cable R-F transmission system comprising the steps of:
    (1) inserting a predetermined fault locator signal frequency into said system;
    (2) locating a plurality of passive R-F emitting coupler-filter units each tuned to said predetermined fault locator signal frequency at points in said system where it is desired to detect possible system faults, and each radiating said R-F fault locator signal into free space;
    (3) traveling to and observing said predetermined fault locator signal frequency which is radiated into free space from each of said coupler-filter locations; and
    (4) investigating for a possible fault at each coupler-filter location where a fault locator signal frequency is absent.
2. The method of claim 1 further including the step of choosing said predetermined fault locator signal frequency whereby it does not interfere with normal cable transmission.
3. The method of claim 1 further including the step of choosing said predetermined fault locator signal frequency whereby it does not interfere with local broadcast or communications transmissions.
4. The method of claim 1 wherein the step of observing includes observation of the fault locator signal frequency by means of an F.M. radio receiver tuned to said fault locator signal frequency.
5. The method of claim 1 wherein the step of observing includes observation of the fault locator signal frequency by means of an R-F leakage detector tuned to said fault locator signal frequency.
6. The method of claim 1 wherein said coupler-filters include an R-F radiating element and an R-F filter.
7. The method of claim 6 wherein said coupler-filter further includes an electrical pick up connection for transmitting said fault locator signal frequency to said filter.
8. The method of claim 6 wherein said coupler-filter further includes an inductive pick up element for transmitting said fault locator signal frequency to said filter.
9. The method of claims 6, 7, or 8 wherein said coupler-filters are located at each amplifier to be observed.
10. The method of claim 6, 7, or 8 wherein said coupler-filters are located at cable splice connectors to be observed.
11. The method of claim 1 wherein the R-F transmission system has a plurality of cable transmission channels, further comprising the step of repeating each of said steps 1 through 4 for each communications channel.
12. The method of claim 11 wherein the predetermined fault locator frequency is different for each cable transmission channel.
13. A coupler-filter for transmitting a selected portion of an R-F signal spectrum from witin a coaxial cable transmission system to the free space region beyond said system comprising in combination:
    (a) means for attaching said signal coupler-filter to said coaxial cable transmission system;
    (b) pick up means for receiving R-F energy signals from said coaxial transmission system;
    (c) narrow band pass passive R-F filter means for permitting only a preselected band of R-F energy signals to pass through said coupler-filter; and

(d) an R-F irradiating means for transmitting said preselected band of R-F energy in free space beyond said coaxial cable system.

14. The coupler-filter of claim 13 wherein said pick up means is an inductive pick up.

15. The coupler-filter of claim 13 wherein said pick up means is a direct connection to an R-F signal source within the coaxial system.

16. The coupler-filter of claim 14 wherein said inductive pick up means is surrounded with a dielectric material.

17. The coupler-filter of claim 13 further comprising means to connect said coupler-filters to said coaxial system by standard coaxial cable threaded connections.

* * * * *